United States Patent
Hall et al.

(10) Patent No.: US 11,781,239 B2
(45) Date of Patent: Oct. 10, 2023

(54) CRYSTALLISATION OF CHEMICAL MOLECULES

(71) Applicant: University of Newcastle upon Tyne, Newcastle upon Tyne (GB)

(72) Inventors: Michael Hall, Newcastle upon Tyne (GB); Michael Probert, Newcastle upon Tyne (GB); Andrew Tyler, Newcastle upon Tyne (GB)

(73) Assignee: University of Newcastle upon Tyne, Tyne and Wear (GB)

( * ) Notice: Subject to any disclaimer, the term of this patent is extended or adjusted under 35 U.S.C. 154(b) by 0 days.

(21) Appl. No.: 17/616,920

(22) PCT Filed: Jun. 11, 2020

(86) PCT No.: PCT/GB2020/051409
§ 371 (c)(1),
(2) Date: Dec. 6, 2021

(87) PCT Pub. No.: WO2020/249951
PCT Pub. Date: Dec. 17, 2020

(65) Prior Publication Data
US 2022/0307154 A1    Sep. 29, 2022

(30) Foreign Application Priority Data
Jun. 11, 2019    (GB) .................................... 1908349

(51) Int. Cl.
*C30B 7/06* (2006.01)
*B01D 9/00* (2006.01)
*C30B 29/58* (2006.01)

(52) U.S. Cl.
CPC .............. *C30B 7/06* (2013.01); *B01D 9/0054* (2013.01); *B01D 9/0077* (2013.01); *C30B 29/58* (2013.01)

(58) Field of Classification Search
CPC ......... C30B 29/58; C30B 7/06; B01D 9/0054; B01D 9/0077
See application file for complete search history.

(56) References Cited

U.S. PATENT DOCUMENTS

| | | | |
|---|---|---|---|
| 2011/0046022 A1 | 2/2011 | Chirgadze et al. | |
| 2017/0198058 A1* | 7/2017 | Christian | A61K 39/39591 |
| 2017/0198059 A1* | 7/2017 | Khalaf | C07K 16/40 |

FOREIGN PATENT DOCUMENTS

| | | |
|---|---|---|
| CN | 108893777 A | 11/2018 |
| GB | 2249492 A | 5/1992 |

OTHER PUBLICATIONS

Chayen "The role of oil in macromolecular crystallization" Sturture vol. 5 No. 10 1997 pp. 1269-1274.*

(Continued)

*Primary Examiner* — Robert M Kunemund
(74) *Attorney, Agent, or Firm* — E. Eric Mills; Maynard Nexsen PC

(57) ABSTRACT

This invention relates to a method of forming crystals of chemical molecules. The methods are effective even when only very small amounts of a compound are available and can be used to explore the experimental crystallisation space including screening for optimal crystallisation conditions such as for polymorphic phases, salts, solvates and co-crystals of chemical molecules and to provide single crystals for structural determination of unknown molecules by single crystal X-ray crystallography.

25 Claims, 3 Drawing Sheets

(56) References Cited

OTHER PUBLICATIONS

Chayen "Microbatch crystallization under oil—a new technique allowing many small-volume crystallization trials" Journal of Crystal Growth vol. 122 (1992) pp. 176-180.*

Almarsson, Orn, et al., High Throughput Surveys of Crystal Form Diversity of Highly Polymorphic Pharmaceutical Compounds, Crystal Growth & Design, 2003, vol. 3, No. 6, 927-933.

Babor, Martin, et al., Microbatch under-oil salt screening of organic cations: single-crystal growth of active pharmaceutical ingredients, IUCrJ, 2019, 6, 145-151.

Bernstein, Joel, Cultivating crystal forms, Chem. Commun., 2005, 5007-5012.

Dawn, Arnab, et al., Supramolecular Gel Control of Cisplatin Crystallization: Identification of a New Solvate Form Using a Cisplatin-Mimetic Gelator, Crystal Growth & Design, 2015, 15, 4591-4599.

Florence, Alastair J., et al., An Automated Parallel Crystallisation Search for Predicted Crystal Structures and Packing Motifs of Carbamazepine, Journal of Pharmaceutical Sciences, Sep. 2006, vol. 95, No. 9, 1918-1930.

Hoshino, Manabu, et al., The crystalline sponge method updated, IUCrJ, 2016, 3, 139-151.

Inokuma, Yasuhide, et al., Preparation and guest-uptake protocol for a porous complex useful for 'crystal-free' crystallography, Nature Protocols, 2014, vol. 9, No. 2, 246-252.

Inokuma, Yasuhide, et al., X-ray analysis on the nanogram to microgram scale using porous complexes, Nature, Mar. 28, 2013, vol. 495, 461-466.

Jones, Christopher G., The CryoEM Method MicroED as a Powerful Tool for Small Molecule Structure Determination, ACS Central Science, 2018, 4, 1587-1592.

Lee, Rachel, et al., Structure of organic solids at low temperature and high pressure, Chem. Soc. Rev., 2014, 43, 4300-4311.

Morissette, Sherry L., et al., Elucidation of crystal form diversity of the HIV protease inhibitor ritonavir by high-throughput crystallization, PNAS, Mar. 4, 2003, vol. 100, No. 5, 2180-2184.

Morissette, Sherry L., et al., High-throughput crystallization: polymorphs, salts, co-crystals and solvates of pharmaceutical solids, Advanced Drug Delivery Reviews, 2004, 56, 275-300.

Nievergelt, Philipp P., et al., A high throughput screening method for the nano-crystallization of salts of organic cations, Chemical Science, 2018, 9, 3716-3722.

Peterson, Matthew L., et al., Iterative High-Throughput Polymorphism Studies on Acetaminophen and an Experimentally Derived Structure for Form III, J. Am. Chem. Soc., 2002, 124, 10958-10959.

Zhu, Dyong, et al., A Double Emulsion-Based, Plastic-Glass Hybrid Microfluidic Platform for Protein Crystallization, Micromachines, Oct. 28, 2015, 6, 1629-1644.

Tyler, Andrew R., et al., Encapsulated Nanodroplet Crystallization of Organic-Soluble Small Molecules, Chem., Jul. 9, 2020, 6(7), 1755-1765.

Alicia Guasch, et al., Purification, crystallization and preliminary X-ray diffraction studies of the bacteriophage o29 connector particle, Federation of European Biochemical Societies, May 26, 1998, 283-287, 430.

Michael Heymann, et al., Room-temperature serial crystallography using a kinetically optimized microfluidic device for protein crystallization and on-chip X-ray diffraction. Corrigendum, IUCrJ, Jul. 23, 2014, 349-360, 1, Germany.

Jung-Uk Shim, et al., Using Microfluidics to Decouple Nucleation and Growth of Protein Crystals, Crystal Growth & Design, Sep. 19, 2007, 2192-2194, vol. 7, No. 11.

* cited by examiner

CRYSTALLISATION OF CHEMICAL MOLECULES

CROSS REFERENCE TO RELATED APPLICATIONS

This application is a 35 U.S.C. § 371 U.S. national phase entry of International Application No. PCT/GB2020/051409 having an international filing date of Jun. 11, 2020, which claims the benefit of Great Britain Application No. 1908349.2 filed Jun. 11, 2019, each of which is incorporated herein by reference in its entirety.

This invention relates to a method of forming crystals of chemical molecules. The methods are effective even when only very small amounts of a compound are available and can be used to explore the experimental crystallisation space including screening for optimal crystallisation conditions such as for polymorphic phases, salts, solvates and co-crystals of chemical molecules and to provide single crystals for structural determination of unknown molecules by single crystal X-ray crystallography.

BACKGROUND

Many small organic molecules are capable of packing together efficiently into a crystalline state. These systems often display multiple forms, including salts, solvates, co-crystals and polymorphic phases that differ only by the relative three dimensional (3D) arrangement of the molecules and their constituent atoms in space. Once suitable crystals of a molecule can be obtained, considerable information about both the atomic connectivity and the three dimensional arrangement of the molecules within the crystal can be determined by a range of analytical techniques, including Raman spectroscopy, X-ray powder diffraction (PXRD) and single crystal X-ray diffraction (SCXRD).

Modern SCXRD remains the analytical technique of choice for high resolution structural analysis (<0.9 Å) allowing access to absolute stereochemical determination, through anomalous dispersion measurements and to the molecular/atomic arrangement within the crystals themselves along with all intermolecular interactions and packing energies. However, SCXRD is not ubiquitously employed as an analysis method for small organic molecules, due to the technical difficulties associated with the crystallisation of the analyte. The required quantities of material and experimental time constraints often restrict the exploration of a molecule's crystallisation space, if initial tests fail, through both traditional (e.g. solvent evaporation, solvent/anti-solvent diffusion) and modern (e.g. gel phase) experimental approaches. Current automation utilised to accelerate the discovery of crystalline phases of organic molecules typically employs grams of analyte.

Any given crystalline solid has the potential to exist in multiple phases known as polymorphs, arising due to different 3D packing arrangements in the solid state. This is particularly pertinent to organic molecules, where the particular polymorphic phase can result in different physical properties (e.g. solubility) of the resulting solid form. This can provide benefits in the pharmaceutical industry, e.g. a readily formed particular polymorphic form of an active pharmaceutical ingredient (API) can simplify regulatory processes, but it can also cause problems, e.g. the unexpected appearance of a stable polymorphic phase of an API can cause significant problems requiring re-formulation.

Additionally, many molecular systems can be crystallised as salts or co-crystals where the desired molecule is either crystallised with a co-former of significantly different pKa to allow charge transfer (salt), or a similar pKa where no charge transfer occurs (co-crystal, including solvates). The resulting systems are then crystalline forms containing both the analyte and co-former(s).

BRIEF SUMMARY OF THE DISCLOSURE

In accordance with the present invention, there is provided a method of forming a crystal of a chemical molecule or a salt thereof, the method comprising:
  a) forming a droplet, the droplet comprising a first liquid and a second liquid; wherein the first liquid comprises the chemical molecule or a salt thereof dissolved in an organic medium; and the second liquid is an oil; and
  b) allowing a crystal comprising the chemical molecule to form in the droplet.

The inventors have found that crystals of chemicals (e.g. molecules) can be formed with a high enough quality for single crystal X-ray diffraction (SCXRD) even when only very small (e.g. <1 mg) amounts of the molecule are available. This is achieved using a droplet as described above. Without wishing to be bound by theory, it is believed that the oil slows down the evaporation of the organic medium allowing the concentration gradient of the molecule in the organic medium to change in a more controlled rate.

The crystal may comprise only the chemical (e.g. organic) molecule or salt thereof. Alternatively, the crystal formed may be a co-crystal. It may be that the first liquid comprises a second chemical (e.g. organic) molecule or salt thereof and the crystal formed is a co-crystal of the two chemical molecules (or salt(s) thereof). It may be that the crystal formed is a solvate of the chemical (e.g. organic) molecule or salt thereof comprising the chemical (e.g. organic) molecule (or salt thereof) and a solvent that is comprised in the organic medium.

The chemical molecule, or salt thereof, may be an organic molecule or salt thereof. The chemical compound may be an organometallic molecule or salt thereof.

The chemical (e.g. organic) molecule or salt thereof may be a protein, a polypeptide, a polynucleotide, a polysaccharide or a salt thereof. The chemical (e.g. organic) molecule or salt thereof may be a conjugate of a small molecule with a species selected from a protein, a polypeptide, a polynucleotide, a polysaccharide or a salt thereof.

Preferably, however, the chemical (e.g. organic) molecule will be a small molecule. For the purposes of this specification, a 'small molecule' may be considered to be a chemical (e.g. organic) molecule (or salt thereof) having a molecular mass below 5000 gmol$^{-1}$. It may be that the 'small molecule' has a molecular mass below 1000 gmol$^{-1}$. A 'small molecule' may be a chemical (e.g. organic) molecule (or salt thereof) comprising less than 100 atoms. A general method for the crystallisation of small amounts (e.g. <1 mg) of small molecules from organic solvents has not been possible prior to the present invention.

The chemical molecule may not be in the form of a salt.

The methods of the invention are particularly effective in the crystallisation of very small amounts of material.

The first liquid comprises the chemical (e.g. organic) molecule dissolved in an organic medium. The organic medium will typically comprise at least one organic solvent.

Alternatively, however, the organic medium may comprise, as an organic component, an ionic liquid or a deep eutectic solvent.

It may be that the organic component of the organic medium (e.g. the at least one organic solvent) is present in a total amount greater than 25% by volume of the organic medium. It may be that the organic component of the organic medium (e.g. the at least one organic solvent) is present in a total amount greater than 50% by volume of the organic medium. It may be that the organic component of the organic medium (e.g. the at least one organic solvent) is present in a total amount greater than 75% by volume of the organic medium. It may be that the organic component of the organic medium (e.g. the at least one organic solvent) is present in a total amount greater than 90% by volume of the organic medium. It may be that the organic component of the organic medium (e.g. the at least one organic solvent) is present in a total amount greater than 95% by volume of the organic medium. The organic medium typically comprises less than 20% water. The organic medium may comprise less than 5% water, e.g. less than 1% water. It may be that the organic medium does not comprise water, i.e. the organic medium comprises a single organic solvent.

Where the organic medium comprises a single organic solvent, it may be that the organic solvent is a polar organic solvent. It may be that the organic solvent is a polar protic organic solvent. It may be that the organic solvent is a polar aprotic organic solvent.

Where the organic medium comprises more than one organic solvent, it may be that at least one organic solvent is a polar organic solvent. It may be that each organic solvent is a polar organic solvent. It may be that at least one organic solvent is a polar protic organic solvent. It may be that each organic solvent is a polar protic organic solvent. It may be that at least one organic solvent is a polar aprotic organic solvent. It may be that each organic solvent is a polar aprotic organic solvent.

Suitable organic solvents for use in the present invention are typically liquid at 25° C. Exemplary organic solvents include: hydrocarbons (e.g. pentane, hexane, heptane, octane, cyclohexane, petroleum ether); aromatic solvents (e.g. benzene, toluene, xylene, cumene, nitrobenzene); chlorinated solvents (e.g. chloroform, dichloromethane, 1,2-dichloroethane, chlorobenzene, 1,2-dichlorobenzene); fluorinated solvents (e.g. fluorobenzene, hexa-fluorobenzene); ethers (e.g. tetrahydrofuran, diethylether, diisopropylether, methyl-butyl-ether, dioxane, methyl or ethyl monoethers of propylene glycol or ethylene glycol, methyl or ethyl diethers of propylene glycol or ethylene glycol, methyl or ethyl monoethers of dipropylene glycol or diethylene glycol, methyl or ethyl diethers of dipropylene glycol or diethylene glycol); esters (e.g. ethyl acetate, isopropyl acetate), ketones (e.g. acetone, methylethylketone, dihydrolevoglucosenone); amides (e.g. N,N-dimethylformamide (DMF), N,N-dimethylacetamide (DMA), N-methyl-2-pyrrolidone (NMP)); sulfoxides (e.g. dimethylsulfoxide (DMSO)); alcohols (e.g. methanol, ethanol, i-propanol, n-propanol, n-butanol, t-butanol); diols (e.g. ethylene glycol, propylene glycol, 2-methyl-2,4-pentanediol); ureas (e.g. N,N'-dimethylpropyleneurea, 1,3-dimethyl-2-imidazolidinone); phosphoramides (e.g. hexamethylphosphoramide).

Suitable organic solvents include polar non-protic solvents, e.g. DMSO, DMF, DMA and NMP.

Where the organic medium comprises a single organic solvent, it may be that the organic solvent has a boiling point greater than 50° C. It may be that the organic solvent has a boiling point greater than 80° C. It may be that the organic solvent has a boiling point greater than 125° C. It may be that the organic solvent has a boiling point in the range from 50° C. to 80° C. Where the organic medium comprises more than one organic solvent, it may be that at least one organic solvent has a boiling point greater than 50° C. It may be that at least one organic solvent has a boiling point greater than 80° C. It may be that at least one organic solvent has a boiling point greater than 125° C. It may be that at least one organic solvent has a boiling point in the range from 50° C. to 80° C. It may be that each organic solvent has a boiling point greater than 50° C. It may be that each organic solvent has a boiling point greater than 80° C. It may be that each organic solvent has a boiling point greater than 125° C. It may be that each organic solvent has a boiling point in the range from 50° C. to 80° C. It may be that the organic medium does not comprise a solvent with a boiling point greater than 250° C. It may be that the organic medium does not comprise a solvent with a boiling point greater than 200° C. It may be that the organic medium does not comprise a solvent with a boiling point greater than 150° C. The inventors have found that solvents with higher boiling points are particularly effective in the methods of the invention. Known crystallisation methods based on larger solvent volumes and sample size are generally unsuccessful or at best impractical with higher boiling point solvents. The rate of evaporation of even a high boiling point solvent is fast enough to provide a practical methodology where the volume of that high boiling point solvent is low. For the absence of doubt, the boiling points referred to above are the boiling points at 1 atm.

The organic medium will typically be selected such that the chemical (e.g. organic) molecule, or salt thereof, is soluble in the organic medium. The organic medium will typically comprise at least one solvent in which the chemical (e.g. organic) molecule, or salt thereof, is soluble.

The methods of the invention are particularly effective in the crystallisation of very small amounts of material. Thus, the first liquid may comprise less than 1 mg of the chemical (e.g. organic) molecule, or salt thereof. The first liquid may comprise less than 500 μg of the chemical (e.g. organic) molecule, or salt thereof. The first liquid may comprise less than 100 μg of the chemical (e.g. organic) molecule, or salt thereof. The first liquid may comprise less than 10 μg of the chemical (e.g. organic) molecule, or salt thereof. The first liquid may comprise less than 5 μg of the chemical (e.g. organic) molecule, or salt thereof.

The total volume of the first liquid in the droplet may be less than 1 μL. The total volume of the first liquid in the droplet may be less than 500 nL. The total volume of the first liquid in the droplet may be less than 200 nL. The total volume of the first liquid in the droplet may be less than 100 nL. Without wishing to be bound by theory, it is believed that the small size of the sample of the first liquid contributes to the success of the method in providing crystals suitable for SCXRD. This may be because the effective lack of convection currents within the sample of the first liquid allows the steady growth of crystals that start to form and/or the minimal nucleation points present in the sample of the first liquid allows initiation of the formation of minimum number of crystals.

The concentration of the chemical (e.g. organic) molecule, or salt thereof, within the organic medium may be in the range from 1 mg/mL to 1 g/mL. The concentration of the chemical (e.g. organic) molecule, or salt thereof, within the organic medium may be in the range from 10 mg/mL to 500 mg/mL. More typically the concentration of the chemical (e.g. organic) molecule, or salt thereof, within the organic medium may be in the range from 10 mg/mL to 800 mg/mL.

The second liquid is an oil. The oil may be fully miscible with the first liquid but more typically is partially miscible or immiscible with the first liquid.

The oil will typically be selected such that the chemical (e.g. organic) molecule, or salt thereof, is substantially insoluble in the oil.

The oil will typically have a viscosity (at 25° C. and 1 atm) in the range from 0.1 cP to 1200 cP. The oil may have a viscosity (at 25° C. and 1 atm) in the range 1 cP to 500 cP. The oil may have a viscosity (at 25° C. and 1 atm) in the range 2 cP to 60 cP.

The oil may be a mineral oil, a paraffin oil, a silicon oil or a perfluorinated oil. The oil may be a silicon oil, e.g. polydimethylsiloxane. The oil may be a perfluorinated oil.

The oil may be a perfluorocarbon, e.g. perfluorooctane.

The oil may be a perfluorinated amine. The oil may be a perfluorinated tertiary amine. The oil may be a perfluorinated tertiary amine with an average molecular weight in the range 200 to 900 gmol$^{-1}$. The oil may be a perfluorinated tertiary amine with an average molecular weight in the range 300 to 700 gmol$^{-1}$. The oil may be an oil selected from perfluorotripentylamine, perfluorotributylamine, perfluorodibutylmethylamine, or a mixture thereof. Illustrative examples include: Fluorinert™ FC-40 (CAS Number 51142-49-5), Fluorinert™ FC-43 (CAS Number 311-89-7), Fluorinert™ FC-770 (CAS Number 1093615-61-2 Fluorinert™ FC-104 (CAS Number 70852-06-1).

The oil may be a perfluoroether or perfluoropolyether. Illustrative examples include: perfluoro(2-n-butyltetrahydrofuran), Fomblin YR-1800, Fomblin Y, Fomblin-M, Fomblin Z-15.

It may be that the oil is not paraffin oil.

It may be that the second liquid forms a coating over the first liquid. The second liquid may encapsulate the first liquid. Alternatively, it may be that a small portion of the surface of the first liquid is not coated with the second liquid. Thus, it may be that greater than 90%, e.g. 95%, of the surface of the first liquid (i.e. the surface of the first liquid that is not in contact with the support surface) is coated with the second liquid.

The ratio first liquid:second liquid may be in the range from 2:1 to 1:20 by volume. The ratio first liquid:second liquid may be in the range from 1:1 to 1:10 by volume. The ratio first liquid:second liquid may be in the range from 1:2 to 1:6 by volume.

Typically, once the droplet comprising the first and second liquid is formed, the droplet (including the first liquid and the second liquid) is not moved while the crystal is forming. It may be that the first liquid does not move. It may be that the second liquid does not move. Thus, the first liquid is not in contact with a continuous flow of the second liquid. Therefore, it may be that the droplet comprising the first and second liquid is not exposed to a continuous flow of an external liquid.

The droplet may be a sitting droplet. Thus, it may be that the sitting droplet comprising the first and the second liquid does not move. Alternatively, the droplet may be a hanging droplet. Thus, it may be that the hanging droplet comprising the first and the second liquid does not move. The amount, surface tension and the viscosity of the oil will be chosen according to the form of the droplet.

A crystal of a seed material may be present in the droplet. Typically, however, no seed material crystal is present.

The step b) may be conducted in the presence of an antisolvent. The antisolvent may be within the droplet or the antisolvent may be not part of the droplet, e.g. the antisolvent may be arranged relative to the droplet such that vapour from the antisolvent can come into contact with the droplet. The antisolvent may be in a second droplet (e.g. not part of the first droplet formed in step a)) or, more typically, the antisolvent will be in an open vessel.

The antisolvent may be comprised in the droplet. Where this is the case, the antisolvent may form part of the first liquid. It may be that the antisolvent does not form part of the first liquid. Alternatively, the antisolvent may initially (i.e. when the droplet is formed) form a third liquid. It may be that the third liquid coats the first liquid and the second liquid coats the third liquid. It may be that the first liquid coats the third liquid and the second liquid coats the first liquid. It may be that the first liquid and the third liquid are in contact and the second liquid coats the surfaces of the third liquid and the first liquid that are not in contact with each other or the support surface on which the droplet has been formed.

It may be that the first liquid and the third liquid are immiscible. It may be that the first liquid and the third liquid are slightly miscible and mix during the course of step b).

The antisolvent may be a solvent selected from the list of suitable organic solvents referred to above. The antisolvent may be water. It may be that the antisolvent is not water. The antisolvent may be ethanol. The antisolvent may be a non-polar solvent, e.g. toluene.

Typically, the antisolvent will be selected such that the chemical molecule is less soluble in the antisolvent than it is in the first liquid.

It may be that the droplet is formed in a vessel, e.g. a well. This might typically be the case where the droplet is a sitting drop. It may be that the method comprises a further step, once the droplet is formed, of sealing the vessel, e.g. well, in which the droplet is formed. It may be that the droplet is formed on a surface. This might typically be the case where the droplet is a hanging drop. It may be that the method comprises a further step, once the droplet is formed, of sealing a vessel, e.g. well, with the surface on which the droplet is formed. Use of a sealed vessel, e.g. a sealed well, can slow the evaporation of the organic medium and can provide better quality crystals. The inventors have, however, formed good quality crystals using the methods of the invention in which the droplet was not in a sealed vessel.

Where an antisolvent is used and that antisolvent is not part of the droplet, the droplet will typically be placed in a sealed system.

The droplet will be formed on a support surface.

The support surface on which the droplet is formed may be flat. The support surface on which the droplet is formed may be concave. This embodiment applies particularly to sitting droplets. The support surface on which the droplet is formed may be convex. This applies particularly to hanging droplets.

The support surface on which the droplet is formed may be glass. The support surface on which the droplet is formed may be plastic.

The support surface on which the droplet is formed may be unmodified. Alternatively, it may be modified to alter its affinity with the first liquid and/or the second liquid, e.g. it may be coated with a material that alters its properties.

The droplet is typically formed by first forming a droplet of the second liquid and then injecting the first liquid into the second liquid to form the droplet.

Alternatively, it may be that a droplet of the first liquid is formed and the second liquid is coated onto the first liquid to form the droplet.

The support surface on which the droplet is formed may be the bottom of a vessel. This is typically the case with a sitting droplet. The vessel may be a well, e.g. a well of a multi-well plate.

It may be that the droplet is formed on the support surface and that support surface is then inverted such that the droplet is below the support surface. This is known as a hanging droplet. Alternatively, it may be that a droplet of the second liquid is formed on the support surface, the surface is inverted to form a hanging droplet of the second liquid and then the first liquid is injected into the second liquid.

The step of allowing the crystal to form typically comprises leaving the droplet for a period of time, e.g. until crystal formation is observed. Thus, the method may comprise the step of looking for signs of crystal formation, e.g. using the naked eye or, more typically, using optical microscopy. The droplet may be left for a period of time from 2 hours to 31 days, e.g. a period of time from 1 day to 14 days.

The droplet may be left at room temperature and atmospheric pressure. Alternatively, the droplet may be left at a temperature below room temperature, e.g. a temperature in the range from −25° C. to 15° C. Alternatively, the droplet may be left at a temperature above room temperature, e.g. a temperature in the range from 30° C. to 60° C.

The crystal may be the only solid formed. More typically, the crystal that is formed is one of a plurality of crystals that are formed or the crystal is formed alongside other solid forms, e.g. amorphous solids or polycrystalline materials.

The method may comprise the step of recovering a crystal. Where, the droplet was in a sealed vessel, this step comprises unsealing the vessel and removing the crystal from the vessel.

The method may comprise the step of performing single crystal X-ray crystallography on the crystal.

The method of the first aspect may be a method of determining the structure of a chemical (e.g. organic) molecule, or salt thereof, the method comprising:
  forming a plurality of droplets according to the first aspect;
  allowing crystals to form from said plurality of droplets;
  looking for signs of crystal formation;
  recovering any crystals that are formed;
  performing single crystal X-ray crystallography on the crystals that are formed; and
  using the results of the single crystal X-ray crystallography to determine the structure of the chemical (e.g. organic) molecule, or salt thereof;
wherein at least two of the plurality of droplets are different.

It may be that no one of the plurality of droplets is the same as any other one of the plurality of droplets. Thus, the plurality of droplets may each be different.

It may be that each droplet is formed in a respective well of a multi-well plate. The droplets may be formed by a robot.

In this method, it is not necessarily the case that crystals form from every droplet. It may be that a crystal forms in only a subset of the droplets. It may be that a crystal forms in only one of the droplets. Even a single crystal may be sufficient to determine the structure of the organic molecule.

The plurality of droplets will typically comprise the same chemical (e.g. organic) molecule, or salt thereof. They may differ in any other aspect of their composition. Examples include: the oil of the second liquid; the solvent or solvents of which the first liquid is comprised; where more than one solvent is present in the first liquid, the relative amounts of those solvents in the first liquid; the concentration of the chemical (e.g. organic) molecule or salt thereof in the first liquid; the amount of the chemical (e.g. organic) molecule, or salt thereof; the amount of the first liquid; the ratio of the second liquid to the first liquid; the presence or absence of an antisolvent; the identity of the antisolvent, if present; the presence or absence of a seeding material; the identity of the seeding material, if present; etc.

The method of determining the structure of a chemical (e.g. organic) molecule, or salt thereof, may additionally comprise forming one or more droplets not according to the first aspect. The formation of the one or more droplets not according to the first aspect may occur before the formation of a plurality of droplets according to the first aspect. The formation of one or more droplets not according to the first aspect may occur at the same time as the formation of a plurality of droplets according to the first aspect. The formation of one or more droplets not according to the first aspect may occur after the formation of a plurality of droplets according to the first aspect. The formation of one or more droplets not according to the first aspect typically occurs at some time before the step of allowing the crystals to form.

It may be that at least one of the one or more droplets not according to the first aspect do not comprise an oil. It may be that at least one of the one or more droplets not according to the first aspect that do not comprise an oil comprise a high boiling point solvent, e.g. a solvent with a boiling point greater than 125° C.

The method of determining the structure of a chemical (e.g. organic) molecule, or salt thereof, that additionally comprises forming one or more droplets not according to the first aspect also comprises subjecting the one or more droplets not according to the first aspect to the subsequent method steps (i.e., every step after the first step) referred to above.

The method of the first aspect may be a method of screening for polymorphs of a chemical (e.g. organic) molecule, or salt thereof, the method comprising:
  forming a plurality of droplets according to the first aspect;
  allowing crystals to form from said plurality of droplets;
  looking for signs of crystal formation;
  recovering any crystals that are formed;
  performing single crystal X-ray crystallography on the crystals that are formed; and
  optionally, comparing the results of the single crystal X-ray crystallography for each crystal to the results of the single crystal X-ray crystallography for each other crystal and/or to known polymorphic forms of the chemical (e.g. organic) molecule, or salt thereof;
wherein at least two of the plurality of droplets are different.

It may be that no one of the plurality of droplets is the same as any other one of the plurality of droplets. Thus, the plurality of droplets may each be different.

It may be that each droplet is formed in a respective well of a multi-well plate. The droplets may be formed by a robot.

In this method, it is not necessarily the case that crystals form from every droplet. It may be that a crystal forms in only a subset of the droplets. It may be that the crystals formed in the droplets have a number of different polymorphic forms.

The plurality of droplets will typically comprise the same chemical (e.g. organic) molecule, or salt thereof. They may differ in any other aspect of their composition. Examples include: the oil of the second liquid; the solvent or solvents of which the first liquid is comprised; where more than one solvent is present in the first liquid, the relative amounts of those solvents in the first liquid; the concentration of the chemical (e.g. organic) molecule or salt thereof in the first liquid; the amount of the chemical (e.g. organic) molecule, or salt thereof; the amount of the first liquid; the ratio of the second liquid to the first liquid; the presence or absence of an antisolvent; the identity of the antisolvent, if present; the presence or absence of a seeding material; the identity of the seeding material, if present; etc.

The method of screening for polymorphs of a chemical (e.g. organic) molecule, or salt thereof, may additionally comprise forming one or more droplets not according to the first aspect. The formation of the one or more droplets not according to the first aspect may occur before the formation of a plurality of droplets according to the first aspect. The formation of one or more droplets not according to the first aspect may occur at the same time as the formation of a plurality of droplets according to the first aspect. The formation of one or more droplets not according to the first aspect may occur after the formation of a plurality of droplets according to the first aspect. The formation of one or more droplets not according to the first aspect typically occurs at some time before the step of allowing the crystals to form.

It may be that at least one of the one or more droplets not according to the first aspect do not comprise an oil. It may be that at least one of the one or more droplets not according to the first aspect that do not comprise an oil comprise a high boiling point solvent, e.g. a solvent with a boiling point greater than 125° C.

The method of screening for polymorphs of a chemical (e.g. organic) molecule, or salt thereof, that additionally comprises forming one or more droplets not according to the first aspect also comprises subjecting the one or more droplets not according to the first aspect to the subsequent method steps (i.e., every step after the first step) referred to above.

BRIEF DESCRIPTION OF THE DRAWINGS

Embodiments of the invention are further described hereinafter with reference to the accompanying drawings, in which.

DETAILED DESCRIPTION

Figure 1:
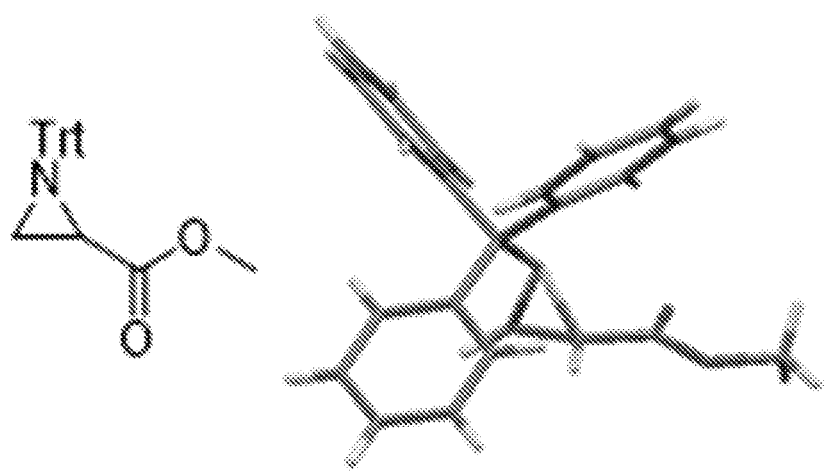
FIG. 1 shows the structure and SCXRD of (S)-methyl 1-tritylaziridine-2-carboxylate

The term 'organic medium' is intended to mean a liquid that comprises an organic component, i.e. an organic component other than the chemical molecule that is being crystallised. The organic component may be an organic solvent, i.e. an uncharged organic molecule, or it may comprise organic components which comprise organic ions, e.g. ionic liquids or deep eutectic solvents. The components of the organic medium will typically be miscible at the relative concentrations at which they are used, but the organic medium may also take other forms, e.g. an emulsion.

The term 'organic solvent' typically refers to organic molecules having no net charge that form a liquid at 25° C. and 1 atm. Typically, they have a molecular mass in the range 30 $gmol^{-1}$ to 150 $gmol^{-1}$, e.g. 40 $gmol^{-1}$ to 100 $gmol^{-1}$.

The term 'oil' typically refers to an inert chemical substance that is a liquid at 25° C. and 1 atm. Oils are typically immiscible with water. Typically, an oil has a boiling point above 250° C. Typically, an oil has a molecular weight above 500 $gmol^{-1}$.

'Organic molecules' typically include at least one carbon-carbon covalent bond and typically comprise only atoms selected from H, C, N, O, P, S, F, Cl, Br and I, said atoms being bonded together by covalent bonds.

Organometallic molecules typically comprise organic portions (i.e. portions include at least one carbon-carbon covalent bond and comprising only atoms selected from H, C, N, O, P, S, F, Cl, Br and I) covalently or datively bonded to metal atoms.

The prefix 'perfluoro-' and the term 'perfluorinated' relate to organic molecules, including those containing heteroatoms, that contain only carbon-fluorine bonds, carbon-carbon bonds and carbon-heteroatom bonds, i.e. do not contain any C—H bonds.

For the purpose of this specification, a droplet is a body of liquid that is in contact with a single surface of a support, said support surface being non-continuous. Thus, the droplets of the invention are in contact with a flat, convex or concave support surface. That support surface may form the base of a vessel or the top of a vessel. The term is intended to exclude bodies of liquid that are simultaneously in contact with the sides and base of a vessel and bodies of liquid that are in contact with a single continuous surface of a tube (e.g. a capillary).

Without wishing to be bound by theory, the benefit of using droplets is that it allows the use of very low volumes of organic medium and oil and are therefore suitable for forming crystals from very low amounts of analyte. Without wishing to be bound by theory, the low volume also minimises the convection currents within the sample and reduces the number of nucleation sites and it is believed that this may also benefit the formation of crystals on a small scale.

The term 'encapsulated' is intended to mean 'completely encapsulated'. The first liquid is encapsulated by the second liquid where all of the surface of the first liquid that is not in contact with the support surface are coated with the second liquid.

The chemical molecule may be present in the form of a salt, e.g. a pharmaceutically acceptable salt. For use in medicine, the salts of the compounds of this invention refer to "pharmaceutically acceptable salts." FDA approved pharmaceutical acceptable salt forms (Ref. International J. Pharm. 1986, 33, 201-217; J. Pharm. Sci., 1977, January, 66 (1)) include pharmaceutically acceptable acidic/anionic or basic/cationic salts. Suitable acidic/anionic salts include, and are not limited to acetate, benzenesulfonate, benzoate, bicarbonate, bitartrate, bromide, calcium edetate, camsylate, carbonate, chloride, citrate, dihydrochloride, edetate, edisylate, estolate, esylate, fumarate, glyceptate, gluconate, glutamate, glycollylarsanilate, hexylresorcinate, hydrabamine, hydrobromide, hydrochloride, hydroxynaphthoate, iodide, isethionate, lactate, maleate, mandelate, mesylate, methylbromide, methylnitrate, methylsulfate, mucate, napsylate, nitrate, pamoate, pantothenate, phosphate, diphosphate, polygalacturonate, salicylate, stearate, subacetate, succinate, sulfate, tannate, tartrate, teoclate, tosylate and triethiodide. Suitable basic/cationic salts include, and are not limited to aluminium, benzathine, calcium, chloroprocaine, choline, diethanolamine, ethylenediamine, lithium, magnesium, potassium, procaine, sodium and zinc. In certain embodiments, however, the chemical molecule may be present not in the form of a salt.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments.

The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

An illustrative method of forming a crystal of a chemical molecule according to the present invention is described below.

General Procedure
Sample Preparation

Stock solutions of the chemical molecule to be crystallised were prepared for each crystallisation experiment. Samples of the chemical molecule were dissolved in the desired solvent. The solution can be heated for up to 40° C. for 30 minutes to ensure full dissolution of solids, followed by cooling to room temperature.

Crystallisation of Substrates

Crystallisation experiments were completed using a TTP labtech Mosquito liquid handling robot using Laminex™ glass 96 well plates with a 100 micron spacer and sealed with a glass cover slip.

Oils (typically 50-300 nL) to be used were dispensed onto the Laminex™ plate using a slow aspirate (1.0 mm/min) and dispense rate (1.0 mm/min) due to oil viscosity. After oil dispensing was completed, chemical molecule solution (typically 50 nL of a 50 mg/mL solution) was injected into each oil droplet. This was then followed by an additional injection of antisolvent (typically 50-150 nL) if desired. The plates were then sealed with a glass cover slip, stored at room temperature and inspected for crystal growth at regular intervals.

Visualisation of the plate wells was carried out with a Nikon SMZ1000 microscope fitted with a cross polariser and photographs taken with a GXCAM-U3-5 5.1MP camera.

Analysis of Crystals

Following observation of crystals within the plate, crystals were extracted from the wells, transferred to a glass slide, separated under a perfluorinated oil and mounted onto a single crystal X-ray diffractometer for analysis.

Exemplary Crystallised Chemical Molecules

The following chemical molecules were crystallised using the general procedure described above and the specific conditions listed in each example below. The determined spacing group and R-factor for each molecule is given. The R-factor is a measure of the agreement between the crystallographic model and the experimental X-ray diffraction data. The minimum possible value is zero, indicating perfect agreement.

Example 1—(S)-Methyl 1-tritylaziridine-2-carboxylate

See FIG. 1.
$P2_1$, R=3.68%
Flack=0.0(2)
Conditions: polydimethylsulfoxide (PDMSO; 200 nL), 40 mg/mL DMF solution (50 nL) with 100 nL water as an antisolvent.

Example 2—Aspirin

Figure 2:
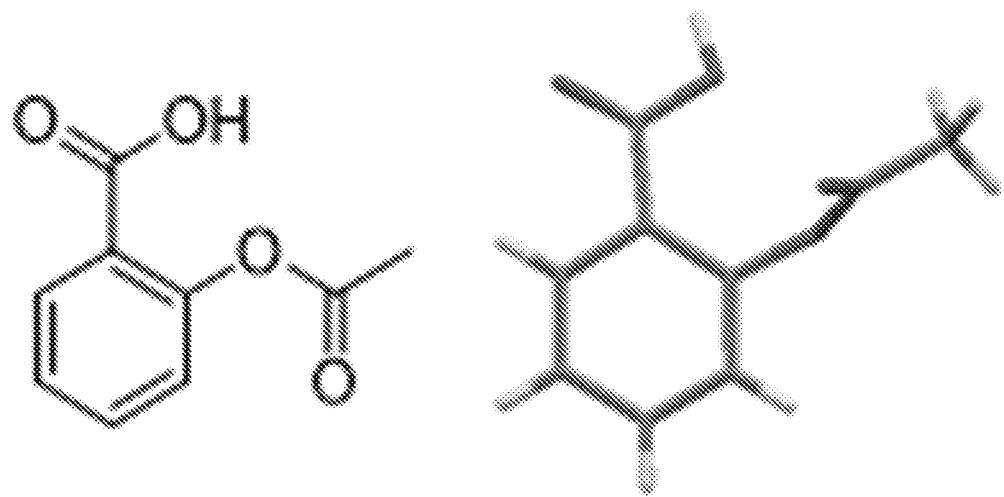
FIG. 2 shows the structure and SCXRD of aspirin

See FIG. 2
$P2_1/c$, R=5.37%
Conditions: Mineral oil (100 nL), 100 mg/ml (±)-2-methyl-2,4-pentanediol solution (50 nL) with 50 nL water as an antisolvent.

Example 3—Nicotinic acid

Figure 3:
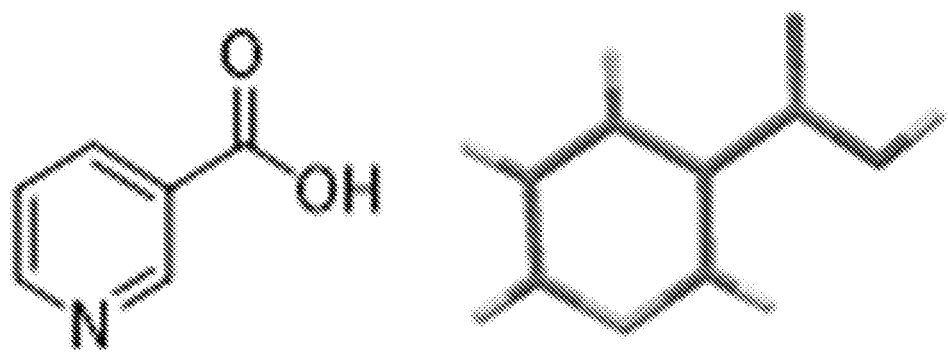
FIG. 3 shows the structure and SCXRD of nicotinic acid

See FIG. 3
$P2_1/c$, R=4.10%
Conditions: Mineral oil (200 nL), 40 mg/mL DMSO solution (50 nL) with 100 nL toluene as an antisolvent.

Example 4—BODIPY

Figure 4:
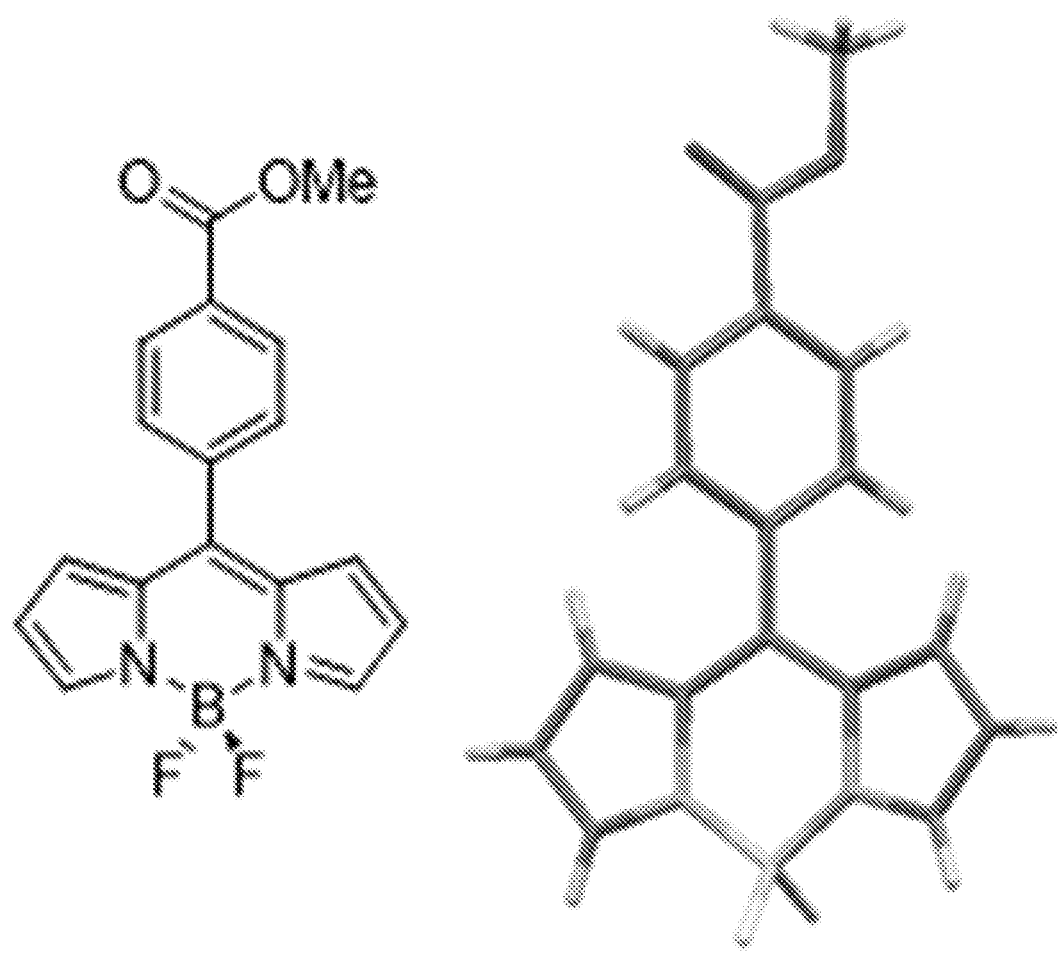
FIG. 4 shows the structure and SCXRD of a BODIPY

See FIG. 4
$P\bar{1}$, R=2.91%
Conditions: PDMSO (300 nL), 20 mg/mL DMF solution (50 nL).

Example 5—Aripiprazole

Figure 5:
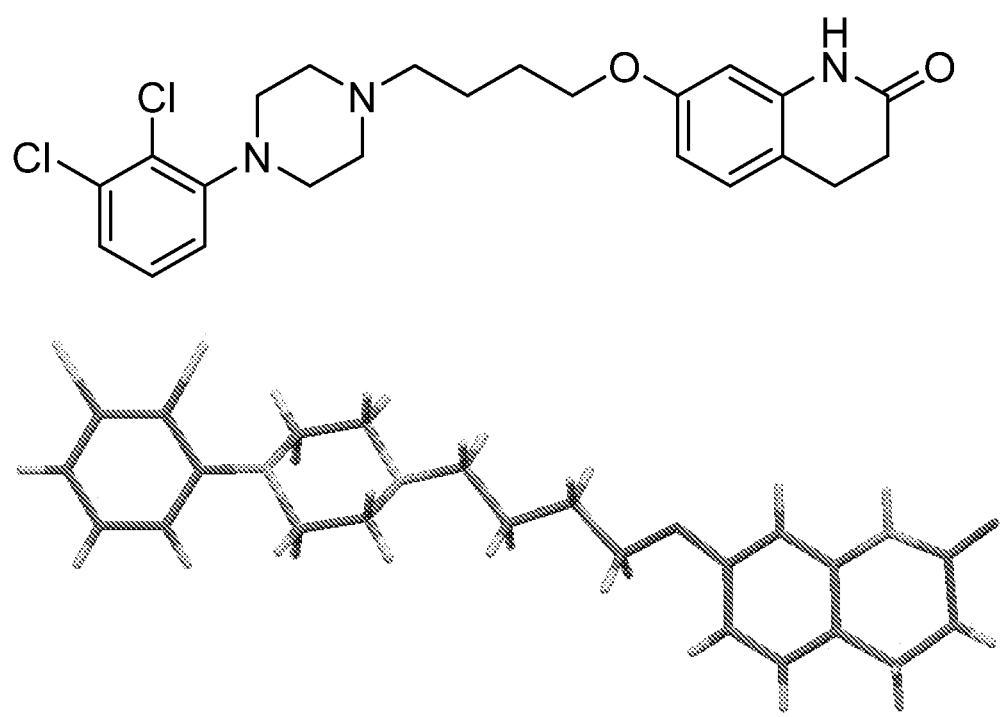
FIG. 5 shows the structure and SCXRD of aripiprazole

See FIG. 5
$P\bar{1}$, R=3.83%
Conditions: Fomblin Y (200 nL), 20 mg/mL DMSO solution (50 nL).

The determined R-factors showed excellent agreement between the crystallographic model and the experimental X-ray diffraction data for each exemplary molecule and this indicates that good quality crystals can be formed using the methods of the invention. It should be noted that absolute stereochemical assignment can also be determined crystallographically, as in the case of (S)-methyl 1-tritylaziridine-2-carboxylate (Flack=0.0(2)).

Polymorph Screening Procedure

A typical polymorph screening was carried out using 5-methyl-2-[(2-nitrophenyl)amino]-3-thiophenecarbonitrile (ROY) as a test substrate, following the general procedure discussed previously. Oils (Flurinert FC-40, Flurinert FC-70, Fomblin YR, Fomblin Y, Fomblin M, Fomblin Z, Mineral oil and polydimethylsiloxane (PDMSO)) were dispensed followed by a DMSO solution containing ROY (50 mg/mL). Additional antisolvents (e.g. water) were added as required.

Plates were then sealed with a Laminex glass cover (MD11-52) and plate at room temperature for up to 31 days. Plates were inspected for suitable crystals and any crystals formed were extracted and analysed as discussed previously.

Polymorph Examples

The following polymorphs of ROY were identified by SCXRD. Crystallisation conditions used for each polymorph are given in brackets.

1. Yellow ROY; $P2_1/n$, R=2.66% [FC-40 (100 nL), 50 mg/mL DMSO solution (50 nL)]
2. R18 ROY; $P\overline{1}$, R=2.99% [Fomblin Z (300 nL), 50 mg/mL DMSO solution, (50 nL)]
3. Red ROY; $P\overline{1}$, R=3.55% [FC-40 (150 nL), 50 mg/ml DMSO solution, (50 nL) with 50 nL water as an antisolvent]
4. ORP ROY; Pbca, R=3.36% [Mineral oil (250 nL), 50 mg/ml DMSO solution, (50 nL)]
5. ON ROY; $P2_1/c$, R=3.57% [Fomblin Z (200 nL), 50 mg/mL DMSO solution (50 nL) with, 50 nL EtOH as an antisolvent]

Four of the known ROY polymorphs (Yellow, Red, ON and ORP) were observed using the procedure described above. In all cases suitable single crystals for SCXRD analysis were obtained.

A ROY polymorph was observed displaying deep red colouration, herein termed R18 ROY, which did not match the colour/morphology profile of known ROY polymorphs. SCXRD confirmed R18 as a previously undiscovered polymorph of ROY. The identification of a new polymorph of a molecule that has been subjected to numerous previous polymorphic screens shows the potency of the methods of the invention in this context.

The invention claimed is:

1. A method forming a crystal of a chemical molecule or a salt thereof, the method comprising:
   a) forming a droplet, the droplet comprising a first liquid and a second liquid; wherein the first liquid comprises the chemical molecule or a salt thereof dissolved in an organic medium; and the second liquid is an oil; and
   b) allowing a crystal comprising the chemical molecule to form in the droplet.
2. A method of claim 1, wherein the chemical molecule is an organic molecule.
3. A method of claim 1, wherein the chemical molecule is a small molecule.
4. A method of claim 1, wherein the organic medium comprises at least one organic solvent.
5. A method of claim 4 wherein the total amount of organic solvent is greater than 75% by volume of the organic medium.
6. A method of claim 1, wherein at least one organic solvent in the organic medium has a boiling point greater than 80° C.
7. A method of claim 6 wherein at least one organic solvent in the organic medium has a boiling point greater than 125° C.
8. A method of claim 1, wherein the first liquid comprises less than 1 mg of the organic molecule, or salt thereof.
9. A method of claim 8, wherein the first liquid comprises less than 100 μg of the organic molecule, or salt thereof.
10. A method of claim 1, wherein the total volume of the first liquid in the droplet may be less than 1 μL.
11. A method of claim 10, wherein the total volume of the first liquid in the droplet may be less than 200 nL.
12. A method of claim 1, wherein the oil is a perfluorinated oil.
13. A method of claim 1, wherein in the droplet, the second liquid forms a coating over the first liquid.
14. A method of claim 13, wherein the second liquid encapsulates the first liquid.
15. A method of claim 1, wherein the ratio first liquid: second liquid is in the range from 2:1 to 1:20 by volume.
16. A method of claim 1, wherein the droplet is a sitting droplet.
17. A method of claim 1, wherein the droplet is a hanging droplet.
18. A method of claim 1, wherein the droplet is formed by first forming a droplet of the second liquid and then injecting the first liquid into the second liquid to form the droplet.
19. A method of claim 1, wherein step b) is conducted in the presence of an antisolvent.
20. A method of claim 1, wherein the surface on which the droplet is formed is a well of a multi-well plate.
21. A method of claim 1, wherein the method comprises the steps:
   recovering a crystal; and
   performing single crystal X-ray crystallography on the crystal.
22. A method of determining the structure of a chemical molecule, or salt thereof, the method comprising:
   forming a plurality of droplets according to claim 1;
   allowing crystals to form from said plurality of droplets;
   looking for signs of crystal formation;
   recovering any crystal that are formed;
   performing single crystal X-ray crystallography on the crystal that are formed; and
   using the results of the single crystal X-ray crystallography to determine the structure of the chemical molecule, or salt thereof.
23. A method of screening for polymorphs of a chemical molecule, or salt thereof, the method comprising:
   forming a plurality of droplets according to claims 1;
   allowing crystals to form from said plurality of droplets;
   looking for signs of crystal formation;
   recovering any crystal that are formed;
   performing single crystal X-ray crystallography on the crystal that are formed; and
   optionally, comparing the results of the single crystal X-ray crystallography for each crystal to the results of the single crystal X-ray crystallography for each other crystal and/or to known polymorphic forms of the chemical molecule or salt thereof;
   wherein at least two of the plurality droplets are different.
24. A method of claim 22, wherein each droplet is formed in a respective well of a multiwall plate.
25. A method of claim 22, wherein the plurality of droplets may each be different.

* * * * *